(12) United States Patent
Raberg

(10) Patent No.: US 10,109,367 B2
(45) Date of Patent: Oct. 23, 2018

(54) MAGNETIC MEMORY DEVICE AND METHOD FOR OPERATING THE SAME

(71) Applicant: Infineon Technologies AG, Neubiberg (DE)

(72) Inventor: Wolfgang Raberg, Sauerlach (DE)

(73) Assignee: Infineon Technologies AG (DE)

(*) Notice: Subject to any disclaimer, the term of this patent is extended or adjusted under 35 U.S.C. 154(b) by 0 days.

(21) Appl. No.: 15/646,306

(22) Filed: Jul. 11, 2017

(65) Prior Publication Data

US 2018/0019019 A1    Jan. 18, 2018

(30) Foreign Application Priority Data

Jul. 12, 2016  (DE) .................. 10 2016 112 765

(51) Int. Cl.
| | | |
|---|---|---|
| *G11C 11/16* | (2006.01) | |
| *G11C 17/18* | (2006.01) | |
| *H01L 43/08* | (2006.01) | |
| *H01L 27/22* | (2006.01) | |
| *G11C 17/16* | (2006.01) | |

(52) U.S. Cl.
CPC ............. *G11C 17/18* (2013.01); *G11C 11/16* (2013.01); *G11C 17/16* (2013.01); *H01L 27/222* (2013.01); *H01L 43/08* (2013.01)

(58) Field of Classification Search
CPC .............................. G11C 11/1675; G11C 11/16
USPC .................................................. 365/97, 158
See application file for complete search history.

(56) References Cited

U.S. PATENT DOCUMENTS

| | | | |
|---|---|---|---|
| 6,269,018 B1* | 7/2001 | Monsma | G11C 11/15 257/E27.005 |
| 6,324,093 B1 | 11/2001 | Perner et al. | |
| 6,801,471 B2 | 10/2004 | Viehmann et al. | |
| 7,095,649 B2* | 8/2006 | Shimizu | G11C 11/16 365/158 |
| 7,286,378 B2* | 10/2007 | Nazarian | B82Y 10/00 365/46 |
| 7,433,220 B2* | 10/2008 | Shiimoto | G11C 13/0007 365/145 |

(Continued)

FOREIGN PATENT DOCUMENTS

DE          60300777 T2    5/2006

*Primary Examiner* — Michael Tran
(74) *Attorney, Agent, or Firm* — Design IP

(57) ABSTRACT

A magnetic memory device is provided. The magnetic memory device includes a memory circuit comprising a first tunnel magnetoresistive element and a second tunnel magnetoresistive element coupled in series. An input node of the magnetic memory device is coupled to the first tunnel magnetoresistive element, wherein the input node is configured to receive a voltage signal. The first tunnel magnetoresistive element initially holds a first resistance value, wherein the first tunnel magnetoresistive element is short-circuited to hold a second resistance value after the voltage signal is received by the input node. End nodes of the memory circuit are coupled to defined voltages in a read mode. The magnetic memory device further includes a read-out circuit configured to measure a voltage at a sensing node in the read mode. The sensing node is interconnected between the first tunnel magnetoresistive element and the second tunnel magnetoresistive element.

22 Claims, 5 Drawing Sheets

(56) References Cited

U.S. PATENT DOCUMENTS

| | | | | |
|---|---|---|---|---|
| 7,859,884 B2* | 12/2010 | Scheuerlein | ........ | G11C 13/0004 |
| | | | | 365/148 |
| 7,894,248 B2* | 2/2011 | Yu | ........................ | G11C 11/1675 |
| | | | | 365/158 |
| 8,264,895 B2* | 9/2012 | Rao | .................... | G11C 13/0004 |
| | | | | 365/148 |
| 8,271,855 B2* | 9/2012 | Norman | ................... | G11C 11/56 |
| | | | | 714/763 |
| 8,482,953 B2* | 7/2013 | Noshiro | .............. | G11C 11/5678 |
| | | | | 365/145 |
| 8,750,032 B2* | 6/2014 | Kawahara | ............. | H01L 27/228 |
| | | | | 365/158 |
| 8,976,569 B2* | 3/2015 | Nickel | ................ | G11C 13/0069 |
| | | | | 365/148 |
| 9,070,465 B2* | 6/2015 | Son | ......................... | G11C 11/161 |
| 9,437,272 B1* | 9/2016 | Lu | .......................... | G11C 11/161 |
| 9,589,615 B2* | 3/2017 | Kulkarni | ............. | G11C 11/1659 |
| 9,678,179 B2* | 6/2017 | Kishi | ................... | G01R 33/1207 |
| 9,728,240 B2* | 8/2017 | Abedifard | ........... | G11C 11/1675 |
| 9,767,915 B2* | 9/2017 | Chung | .................... | G11C 17/06 |
| 2003/0156469 A1 | 8/2003 | Viehmann et al. | | |
| 2003/0179601 A1* | 9/2003 | Seyyedy | ................ | G11C 11/15 |
| | | | | 365/158 |
| 2005/0073878 A1* | 4/2005 | Lin | ......................... | G11C 11/15 |
| | | | | 365/158 |
| 2005/0237788 A1* | 10/2005 | Kano | ...................... | G11C 11/16 |
| | | | | 365/158 |
| 2006/0039183 A1* | 2/2006 | Lin | ......................... | G11C 11/16 |
| | | | | 365/158 |
| 2008/0170432 A1* | 7/2008 | Asao | ....................... | G11C 11/16 |
| | | | | 365/171 |
| 2013/0076550 A1* | 3/2013 | Marukame | ............. | H01L 43/08 |
| | | | | 341/158 |

* cited by examiner

MAGNETIC MEMORY DEVICE AND METHOD FOR OPERATING THE SAME

FIELD

The present disclosure relates generally to storing information. In particular, examples relate to a magnetic memory device and a method for operating a magnetic memory device.

BACKGROUND

For sensor or other applications it is desirable or even mandatory to store a limited amount of data on the sensor chip before first use. For example, calibration data, a chip ID or information on a use mode may be stored.

Conventionally, laser fuses (large in size, future availability unknown), EEPROM (large, requires CMOS front-end), diode fuses (requires large currents for fusing) or flash memory (requires additional CMOS front-end) are used to store information. All these storage types have in common that they are either relatively large in size, or require CMOS front-end processing. However, CMOS processing may be not required for the manufacturing process of the further sensor parts.

Hence, there may be a desire for an alternative memory device enabling facilitated manufacturing processes and/or reduced chip area.

SUMMARY

Examples provided herein relate to one or more a magnetic memory devices and one or more methods for operating a magnetic memory device.

An example relates to a magnetic memory device. The magnetic memory device comprises a memory circuit comprising a first tunnel magnetoresistive (TMR) element and a second TMR element coupled in series. An input node of the magnetic memory device is coupled to the first TMR element, wherein the input node is configured to receive a voltage signal. The first TMR element initially holds a first resistance value, wherein the first TMR element is short-circuited to hold a second resistance value after the voltage signal is received by the input node. End nodes of the memory circuit are coupled to defined voltages in a read mode. The magnetic memory device further comprises a read-out circuit configured to measure a voltage at a sensing node in the read mode. The sensing node is interconnected between the first tunnel magnetoresistive element and the second tunnel magnetoresistive element. The magnetic memory device may be realized solely in a TMR processing block. For example, for applications where a TMR based sensor is realized, the magnetic memory device may be realized simultaneously with the sensor fabrication. Moreover, the magnetic memory device may be incorporated on a semiconductor chip with only small increase of chip area. Hence, memory solutions which require a lot of chip area may be replaced by the proposed magnetic memory device.

Another example relates a memory system comprising the above magnetic memory device and a programming circuit configured to supply the voltage signal to the input node of the magnetic memory device for setting a second memory state which is different from an initial first memory state of the magnetic memory device. A memory system is, hence, provided which may be programmed once using the programming circuit. Accordingly, a set of data may be stored in an area efficient manner.

Still another example relates to a semiconductor chip comprising a TMR structure, wherein a magnetic sensor device is formed in a first portion of the TMR structure, and wherein the magnetic memory device is formed in a second portion of the TMR structure. The magnetic memory device and the magnetic sensor device may be fabricated simultaneously, so that the production costs of the semiconductor chip may be lowered.

A further example relates to a semiconductor chip comprising a semiconductor device and the above magnetic memory device. Hence, a memory device for the semiconductor device which requires merely little chip area may be provided. This may enable more accurate control of system states, e.g., in power semiconductors. It may enable back end calibration of power semiconductors without significant area consumption.

Another example relates to a method for operating a magnetic memory device comprising a memory circuit with a first TMR element and a second TMR element coupled in series. The method comprises setting the first TMR element to a first resistance value or to a second resistance value in a write mode, wherein the first TMR element is set to the second resistance value by short circuiting the first TMR element. End nodes of the memory circuit are coupled to defined voltages in a read mode. The method further comprises measuring a voltage at a sensing node in the read mode. The sensing node is interconnected between the first tunnel magnetoresistive element and the second tunnel magnetoresistive element. The proposed method may allow to efficiently operate a magnetic memory device which requires merely small chip area.

BRIEF DESCRIPTION OF THE DRAWINGS

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent", to name just a few examples).

The terminology used herein is for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong, unless expressly defined otherwise herein.

Figure 1:
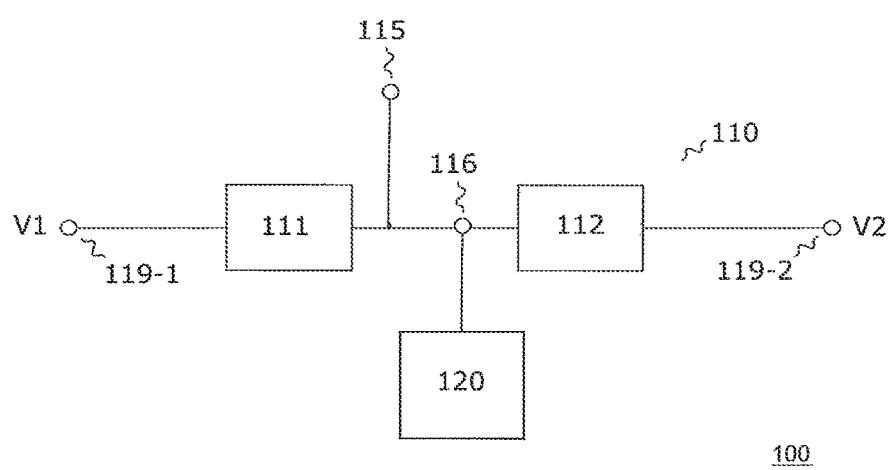
FIG. 1 illustrates an example of a magnetic memory device according to one or more embodiments.

FIG. 1 illustrates a magnetic memory device 100. The magnetic memory device 100 comprises a memory circuit 110 comprising a first TMR element 111 and a second TMR element 112 which are coupled in series. The first TMR element 111 and the second TMR element 112 are distinct areas of a layered structure which exhibit the TMR effect. For example, the first TMR element 111 and the second TMR element 112 may be provided with sizes in the range of a few ten nanometers to several ten micrometers.

An input node 115 of the magnetic memory device 100 is coupled to the first TMR element 115. The input node 115 is configured to receive a voltage signal in a write mode (i.e. a first mode of operation of the magnetic memory device 100). A voltage of the voltage signal applied to the input node 115 may, e.g., be higher than a breakdown voltage of a magnetic tunnel junction of the first TMR element 111.

The first TMR element 111 initially holds a first resistance value which may, e.g., correspond to the intrinsic resistance of the magnetic tunnel junction of the first TMR element 111. The first TMR element 111 is short-circuited to hold a second resistance value after the voltage signal is received by the input node 115. A ratio of the first resistance value to the second resistance value may, e.g., be 500 or more.

That is, the first TMR element 111 is either set to the first resistance value or to the different second resistance value in the write mode. Accordingly, information may be stored in the magnetic memory device 100. Moreover, the magnetic memory device 100 may be realized solely in a TMR processing block. For example, for applications where a TMR based semiconductor device is realized, the magnetic memory device may be realized simultaneously with the device fabrication. Moreover, the magnetic memory device may be incorporated on a semiconductor chip with only small increase of chip area.

For reading out the stored information, end nodes 119-1, 119-2 of the memory circuit 110 may be coupled to defined voltages V1, V2 in a read mode (i.e. a second mode of operation of the magnetic memory device 100). V1 may, e.g., be ground and V2 may, e.g., be an operating voltage available on a semiconductor chip on which the magnetic memory device 100 is implemented. Accordingly, a defined voltage difference may be applied to the memory circuit 110. Further, the magnetic memory device 100 further may comprise a read-out circuit 120 configured to measure a voltage at a sensing node 116 in the read mode, wherein the sensing node 116 is interconnected between the first TMR element 111 and the second TMR element 112.

If the voltage signal is not received by the input node 115 in the write mode, the value of the voltage at the sensing node 116 (compared to V1) is a fraction of the voltage difference applied to the end nodes 119-1, 119-2 of the memory circuit 110, wherein the fraction is determined by the ratio of the intrinsic resistances of the magnetic tunnel junctions of the first TMR element 111 and the second TMR element 112. For example, if the intrinsic resistances of the magnetic tunnel junctions of the first TMR element 111 and the second TMR element 112 are equal, the value of the voltage at the sensing node 116 is 50% of the voltage difference applied to the end nodes 119-1, 119-2 of the memory circuit 110. Even if an external magnetic field changes its direction, the value of the voltage at the sensing node 116 remains the same since the resistance of TMR element 111 and the second TMR element 112 change the same way.

If the voltage signal is received by the input node 115 in the write mode, the value of the voltage at the sensing node 116 is approximately zero (compared to V1). This is due to the fact that the first TMR element 111 is permanently short-circuited after receiving the voltage signal in the write mode.

Figure 2:
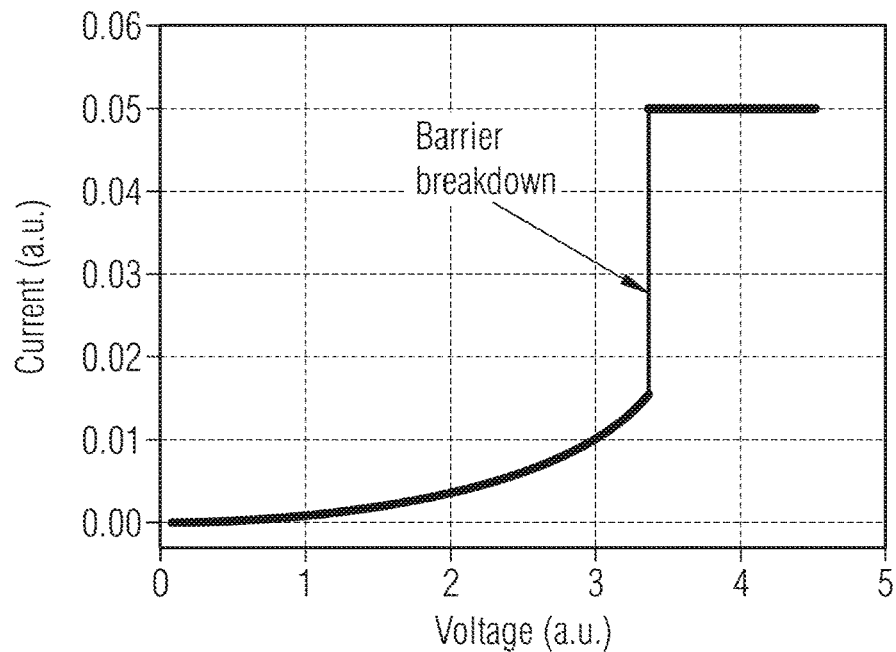
FIG. 2 illustrates an example of a relation between a voltage applied to a tunnel junction and a current through the tunnel junction according to one or more embodiments.

In order to illustrate the short-circuiting of the first TMR element 111, FIG. 2 illustrates an example of a relation between a voltage (in arbitrary units) applied to the first TMR element's tunnel junction and a current (in arbitrary units) through the first TMR element's tunnel junction.

It is evident from FIG. 2 that the current increase non-linearly with increasing voltage until a threshold value is reached above which a sudden breakdown leads to a shorted TMR element. For example, an intrinsic resistance of the magnetic tunnel junction of several kiloohm (kΩ) may be reduced to a few Ohm (Ω).

The magnetic memory device 100 uses this behavior by comprising the first TMR element 111 which may be programmed once (e.g. using an internal or external programming circuit). The stored information is, hence, coded in different voltage levels at the sensing node 116.

Accordingly, the read-out circuit 120 may be further configured to determine a first memory state for a first value of the voltage at the sensing node 116 and to determine a second memory state for a second value of the voltage at the sensing node 116. That is, binary information may be stored in the magnetic memory device 100.

In other words, a chain of TMR elements (cells) is created. One part of the chain is used for fusing to create a short. The fused state is detected by the measuring voltage value between the fused cell and the remainder of the cells. Although working cells change their resistance with change of an external magnetic field, the voltage value will not change as all cells change the same way.

The magnetic memory device 100 may comprise one or more additional optional features corresponding to one or more aspects of the proposed concept or one or more examples described below.

Figure 3:
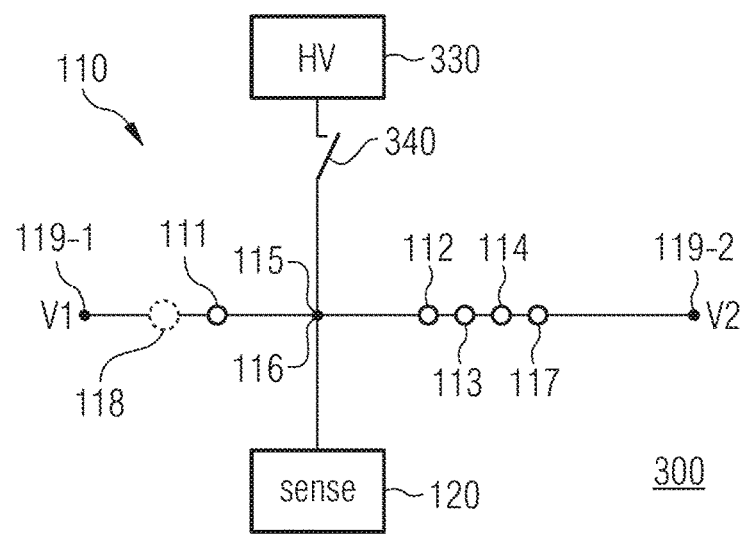
FIG. 3 illustrates another example of a magnetic memory device according to one or more embodiments.

In FIG. 3, another magnetic memory device 300 is illustrated. Also the magnetic memory device 300 comprises a memory circuit 110 with a first TMR element 111 and a second TMR element 112 which are coupled in series. In the example of FIG. 3, the input node 115 and the sensing node 116 are implemented as a combined node interconnected between the first TMR element 111 and the second TMR element 112.

The memory circuit 110 further comprises a fourth TMR element 113. For example, an intrinsic resistance of a magnetic tunnel junction of the fourth TMR element 113 may be equal to an intrinsic resistance of a magnetic tunnel junction of the second TMR element 112. Alternatively, the intrinsic resistance of the magnetic tunnel junction of the fourth TMR element 113 may differ from the intrinsic resistance of the magnetic tunnel junction of the second TMR element 112 by at least 5% (e.g. 5%, 10%, 15%, or 20%).

In addition, the memory circuit 110 further comprises a fifth TMR element 114 and a sixth TMR element 117. Similarly, the intrinsic resistances of the magnetic tunnel junctions of the fifth TMR element 114 and/or the sixth TMR element 117 may be equal to the intrinsic resistance of the magnetic tunnel junction of the second TMR element 112. Alternatively, the intrinsic resistances of the magnetic tunnel junctions of the fifth TMR element 114 and/or the sixth TMR element 117 may differ from the intrinsic resistance of the magnetic tunnel junction of the second TMR element 112 by at least 5% (e.g. 5%, 10%, 15%, or 20%).

That is, TMR elements with equal intrinsic resistance or TMR elements with varying intrinsic resistance may be used. The intrinsic resistance of the magnetic tunnel junction of one of the TMR elements may be adjusted by selecting the size of the TMR element. For example, a TMR element may be provided with sizes in the range of a few ten nanometers to several ten micrometers.

Accordingly, a voltage level at the sensing node 116 in the read mode may adjusted for the case that the first TMR 111 is not short-circuited (i.e. the voltage signal is not received by the input node 115 in the write mode). For example, if the first TMR element 111 is not short-circuited and if the intrinsic resistances of the magnetic tunnel junctions of the first TMR element 111, the second TMR element 112, the fourth TMR element 113, the fifth TMR element 114 and the sixth TMR element 117 are equal, the value of the voltage at the sensing node 116 (compared to V1) is 20% of the voltage difference applied to the end nodes 119-1, 119-2 of the memory circuit 110. If the first TMR element 111 is short-circuited, the voltage at the sensing node 116 (compared to V1) is approximately zero.

Hence, measuring the voltage at the sensing node 116 may allow to determine two different states of the memory device 610. Adjusting the number of TMR cells, which are not short-circuited, may further allow to add additional control information. For example, if one of the second TMR element 112, the fourth TMR element 113, the fifth TMR element 114 and the sixth TMR element 117 suffers from an accidental breakdown, the value of the voltage at the sensing node 116 (compared to V1) is no longer 20% of the voltage difference applied to the end nodes 119-1, 119-2 of the memory circuit 110, but approximately 25% of the voltage difference. Accordingly, the read-out circuit 120 may determine that the measured voltage does not correspond to the voltage of one of the two memory states. That is, the read-out circuit 120 may determine that memory device 300 is in a failure state. In other words, the scalability of the resistance via the size of the junction can be used to incorporate an additional control mechanism to make sure that accidental reprogramming by accidental breakdown of (non-programmed) functional TMR elements (cells) is detected.

The short-circuiting of the first TMR element 111 is indicated in FIG. 3 by switch 340 which may couple the first TMR element 111 to a "High Voltage" (HV) source 330. The switch 340 may, e.g., be controlled by an internal or external programming circuit (not illustrated). However, it is to be noted that HV in the context of this disclosure relates to any voltage which is higher than the breakdown voltage of the magnetic tunnel junction of the first TMR element 111. For example, the HV source 330 may supply a voltage of 3 Volt (V), 4 V, 5 V, 6 V, 7 V, 8 V, 9 V, 10 V, 12 V, 15 V, 18 V, or 20 V. Depending on the concrete design of the magnetic memory device, the voltage of the voltage signal supplied by the HV source 330 may be equal to the voltage difference applied to the end nodes 119-1, 119-2 of the memory circuit 110.

As indicated in FIG. 3, the memory circuit 110 may further comprise a third TMR element 118 which initially holds a third resistance value. Also the third TMR element 118 is short-circuited to hold a fourth resistance value after the voltage signal is received by the input node 115. The third resistance value may, e.g., equal to the first resistance value of the first TMR element 111. Alternatively, the third resistance value may differ from the first resistance value by at least 5% (e.g. 5%, 10%, 15%, or 20%). That is, TMR elements with equal intrinsic resistance or TMR cells with varying intrinsic resistance may be used. Different intrinsic resistances of the first TMR element 111 and the third TMR element 118 may, e.g., be adjusted by selecting different sizes for the first TMR element 111 and the third TMR element 118.

By using more than one TMR element, which may be short-circuited in the write mode, the magnetic memory device 300 may store more memory states. By short-circuiting none, one or both of the first TMR 111 and the third TMR element 118, three different voltage levels at the sensing node 116 may be adjusted in the read mode. Accordingly, more complex information may be stored in the magnetic memory device 300.

From the foregoing description, it is evident for a person skilled in the art that the present disclosure is not limited to magnetic memory devices comprising two TMR elements, which may be short-circuited, and four TMR elements, which cannot be short-circuited. In general, any number of TMR elements, which may be short-circuited, and any number of TMR elements, which cannot be short-circuited, may be used.

Figure 4:
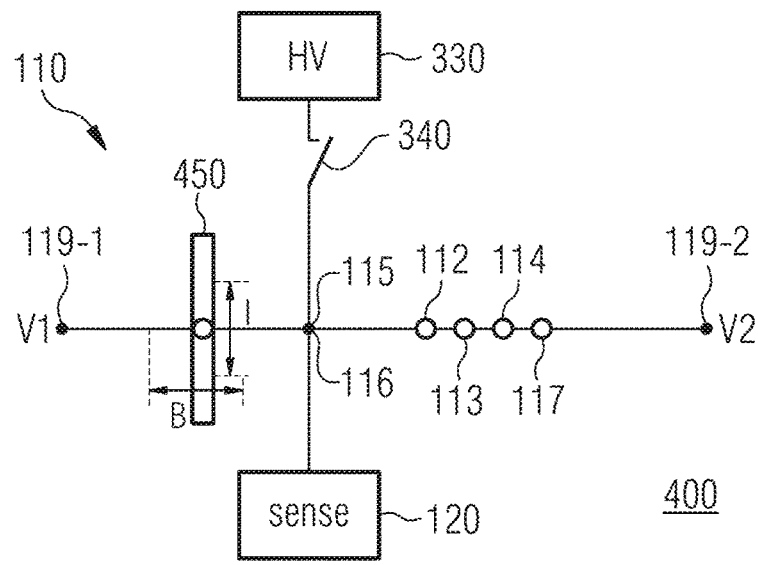
FIG. 4 illustrates still another example of a magnetic memory device according to one or more embodiments.

In FIG. 4, another magnetic memory device 400 is illustrated which is similar to the magnetic memory device 300 of FIG. 3. However, the magnetic memory device 400 further comprises a test circuit 450 configured to expose the first TMR element 111 to a magnetic field B at a first time instant. For example, if the magnetic memory device 400 is implemented in a semiconductor chip, the test circuit 450 may be implemented by a Wire-On-Chip (WOC), so that a current I flowing through the WOC generates the magnetic field B.

The read-out circuit 120 is configured to verify that the first TMR element 111 holds the second resistance value by comparing the voltage at the sensing node 116 at the first time instant (at which the test circuit 450 generates the magnetic field) and the voltage at the sensing node 116 at a second time instant at which the test circuit 450 does not generate the magnetic field B.

Only the first TMR element 111 is exposed to the magnetic field B. Hence, if the first TMR element 111 is short-circuited (to hold the second resistance value), the presence of the magnetic field B does not change the resistance of the first TMR element 111. On the contrary, if the first TMR element 111 is by accident not short-circuited because the short-circuiting in the write mode failed, the resistance of the first TMR element 111 changes since the magnetization of a free layer of the first TMR element 111 changes with the magnetic field B being present. Accordingly, the voltage at the sensing node 116 will be equal for the first time instant and the second time instant if the first TMR element 111 is short-circuited. On the other hand, the voltage at the sensing node 116 will be different for the first time instant and the second time instant if short-circuiting the first TMR element 111 failed.

Hence, comparing the voltage at the sensing node 116 for the magnetic field being absent and the magnetic field being present may allow to verify that short-circuiting of the first TMR element 111 was successful. That is, verification of shorted cells may be done by testing the magnetic response to a WOC field. If a plurality of magnetic memory devices is provided on a semiconductor chip, a single WOC may be arranged along the plurality of magnetic memory devices in order to verify for each of the plurality of magnetic memory devices that the short-circuiting of a respective TMR element was successful. Accordingly, the verification of shorted cells may be done in parallel for the plurality of magnetic memory devices.

Figure 5:
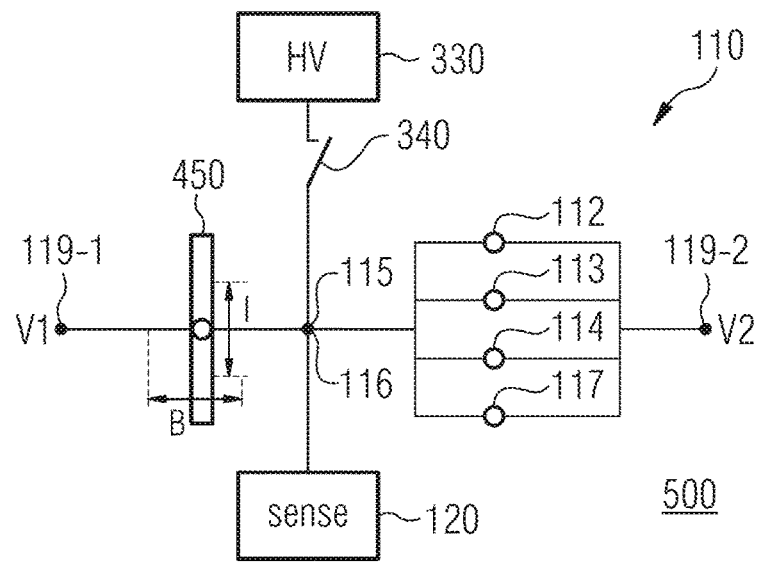
FIG. 5 illustrates a further example of a magnetic memory device according to one or more embodiments.

FIG. 5 illustrates a magnetic memory device 500 which is similar to the magnetic memory device 400 of FIG. 4. However, in the magnetic memory device 500 the second TMR element 112, the fourth TMR element 113, the fifth TMR element 114 and the sixth TMR element 117 are coupled in parallel to each other. It is evident from FIGS. 4 and 5 that the plural TMR elements, which cannot be short-circuited in the write mode, can be coupled in series or in parallel to each other. However, it is to be noted the plural TMR elements, which cannot be short-circuited in the write mode, are coupled in series to the first TMR element 111, which can be short-circuited in the write mode.

Although not illustrated, also plural TMR elements, which can be short-circuited in the write mode, may be coupled in series or in parallel to each other. However, it is to be noted the plural TMR elements, which can be short-circuited in the write mode, are coupled in series to the at least one TMR element, which cannot be short-circuited in the write mode.

Figure 6:
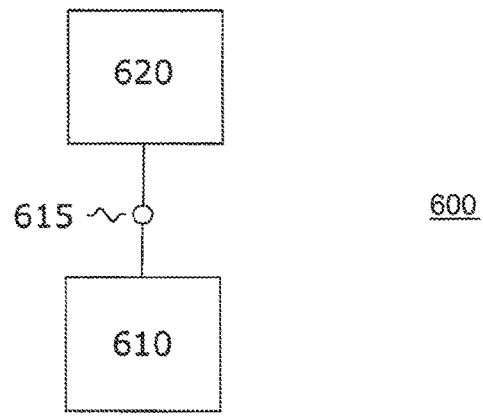
FIG. 6 illustrates an example of a memory system according to one or more embodiments.

A memory system 600 comprising a magnetic memory device 610 according to one or more aspects of the proposed concept or one or more examples described above is illustrated in FIG. 6. The memory system 600 further comprises a programming circuit 620 which is configured to supply the voltage signal to the input node 615 of the magnetic memory device 610 for setting a second memory state which is different from an initial first memory state of the magnetic memory device 610. A memory system is, hence, provided which may be programmed once using the programming circuit. Accordingly, a set of data may be stored in an area efficient manner. For example, when used with a sensor device, calibration data or use mode information for the sensor device may be stored in the magnetic memory device 610 before first use of the sensor device.

Figure 7:
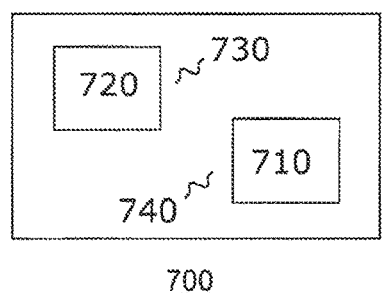
FIG. 7 illustrates an example of a semiconductor chip according to one or more embodiments.

An example of an implementation using a magnetic memory device according to one or more aspects of the proposed concept or one or more examples described above is illustrated in FIG. 7. FIG. 7 schematically illustrates an example of a semiconductor chip 700. The semiconductor chip 700 comprises a TMR structure. A magnetic sensor device 720 (e.g. a wheel speed sensor) is formed in a first portion 730 of the TMR structure. A magnetic memory device 710 according to one or more aspects of the proposed concept or one or more examples described above is formed in a second portion 740 of the TMR structure. The magnetic memory device 710 and the magnetic sensor device 720 may be fabricated simultaneously, so that production costs of the semiconductor chip 700 may be lower compared to conventional semiconductor chip arrangements comprising a magnetic sensor device and a conventional memory.

Figure 8:
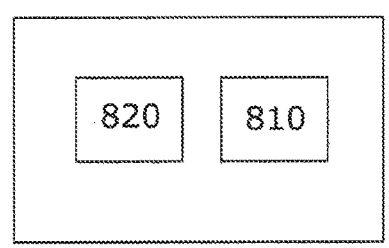
FIG. 8 illustrates another example of a semiconductor chip according to one or more embodiments.

Another example of an implementation using a magnetic memory device according to one or more aspects of the proposed concept or one or more examples described above is illustrated in FIG. 8. FIG. 8 schematically illustrates an example of a semiconductor chip 800. The semiconductor chip 800 comprises a semiconductor device 820 (e.g. a semiconductor circuit) and a magnetic memory device 810 according to one or more aspects of the proposed concept or one or more examples described above. Hence, a semiconductor chip comprising a memory device for the semiconductor device which requires merely little chip area may be provided. This may enable more accurate control of system states, e.g., in power semiconductors. It may enable back end calibration of power semiconductors without significant area consumption.

Figure 9:
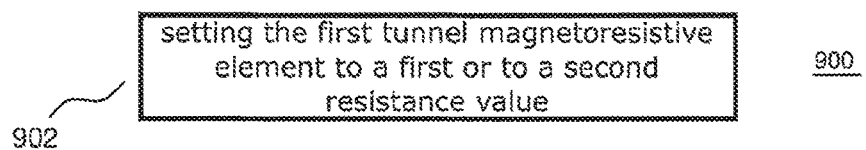
FIG. 9 illustrates a flowchart of an example of a method for operating a magnetic memory device according to one or more embodiments.

An example of a method 900 for operating a magnetic memory device comprising a memory circuit with a first TMR element and a second TMR element coupled in series is illustrated by means of a flowchart in FIG. 9. The method comprises setting 902 the first TMR element to a first resistance value or to a second resistance value in a write mode, wherein the first TMR element is set to the second resistance value by short circuiting the first TMR element. A ratio of the first resistance value to the second resistance value may, e.g., be 500 or more. Short circuiting the first TMR element may, e.g., comprise applying a voltage to the first TMR element which is higher than a breakdown voltage of a magnetic tunnel junction of the first TMR element.

The method 900 may allow to efficiently operate a magnetic memory device which requires merely small chip area.

Optionally, end nodes of the memory circuit are coupled to defined voltages in a read mode and the method 900 further comprises measuring a voltage at a sensing node in the read mode, wherein the sensing node is interconnected between the first TMR element and the second TMR element.

Further optionally, the method 900 further comprises determining a first memory state for a first value of the voltage at the sensing node and to determine a second memory state for a second value of the voltage at the sensing node.

In some examples, the method 900 further comprises exposing the first TMR element to a magnetic field at a first time instant, and verifying that the first TMR element is set to the second resistance value by comparing the voltage at the sensing node at the first time instant and the voltage at the sensing node at a second time instant at which the test circuit does not generate the magnetic field.

More details and aspects of the method are mentioned in connection with the proposed concept or one or more examples described above (e.g. FIGS. 1-8). The method may comprise one or more additional optional features corresponding to one or more aspects of the proposed concept or one or more examples described above.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A magnetic memory device, comprising:
a memory circuit comprising a first tunnel magnetoresistive element and a second tunnel magnetoresistive element coupled in series; and
an input node coupled to the first tunnel magnetoresistive element, wherein the input node is configured to receive a voltage signal in a write mode,
wherein the first tunnel magnetoresistive element initially holds a first resistance value, and wherein the first tunnel magnetoresistive element is short-circuited to hold a second resistance value after the voltage signal is received by the input node,
wherein end nodes of the memory circuit are coupled to defined voltages in a read mode, and wherein the magnetic memory device further comprises a read-out circuit configured to measure a voltage at a sensing node in the read mode, wherein the sensing node is interconnected between the first tunnel magnetoresistive element and the second tunnel magnetoresistive element.

2. The magnetic memory device of claim 1, wherein the read-out circuit is further configured to determine a first memory state for a first value of the voltage at the sensing node and to determine a second memory state for a second value of the voltage at the sensing node.

3. The magnetic memory device of claim 1, further comprising a test circuit configured to expose the first tunnel magnetoresistive element to a magnetic field at a first time instant, wherein the read-out circuit is further configured to verify that the first tunnel magnetoresistive element holds the second resistance value by comparing the voltage at the sensing node at the first time instant and the voltage at the sensing node at a second time instant at which the test circuit does not generate the magnetic field.

4. The magnetic memory device of claim 1, wherein a voltage of the voltage signal is higher than a breakdown voltage of a magnetic tunnel junction of the first tunnel magnetoresistive element.

5. The magnetic memory device of claim 1, wherein the first resistance value corresponds to an intrinsic resistance of a magnetic tunnel junction of the first tunnel magnetoresistive element.

6. The magnetic memory device of claim 1, wherein a ratio of the first resistance value to the second resistance value is 500or more.

7. The magnetic memory device of claim 1, wherein the memory circuit further comprises a third tunnel magnetoresistive element, wherein the third tunnel magnetoresistive element initially holds a third resistance value, and wherein the third tunnel magnetoresistive element is short-circuited to hold a fourth resistance value after the voltage signal is received by the input node.

8. The magnetic memory device of claim 7, wherein the third resistance value is equal to the first resistance value.

9. The magnetic memory device of claim 7, wherein the third resistance value differs from the first resistance value by at least 5%.

10. The magnetic memory device of claim 1, wherein the memory circuit further comprises a fourth tunnel magnetoresistive element, wherein an intrinsic resistance of a magnetic tunnel junction of the fourth tunnel magnetoresistive element is equal to an intrinsic resistance of a magnetic tunnel junction of the second tunnel magnetoresistive element.

11. The magnetic memory device of claim 1, wherein the memory circuit further comprises a fourth tunnel magnetoresistive element, wherein an intrinsic resistance of a magnetic tunnel junction of the fourth tunnel magnetoresistive element differs from an intrinsic resistance of a magnetic tunnel junction of the second tunnel magnetoresistive element by at least 5%.

12. A memory system, comprising:
    a magnetic memory device comprising:
        a memory circuit comprising a first tunnel magnetoresistive element and a second tunnel magnetoresistive element coupled in series; and
        an input node coupled to the first tunnel magnetoresistive element, wherein the input node is configured to receive a voltage signal in a write mode,
        wherein the first tunnel magnetoresistive element initially holds a first resistance value, and wherein the first tunnel magnetoresistive element is short-circuited to hold a second resistance value after the voltage signal is received by the input node, and
        wherein end nodes of the memory circuit are coupled to defined voltages in a read mode, and wherein the magnetic memory device further comprises a readout circuit configured to measure a voltage at a sensing node in the read mode, wherein the sensing node is interconnected between the first tunnel magnetoresistive element and the second tunnel magnetoresistive element; and
    a programming circuit configured to supply the voltage signal to the input node of the magnetic memory device for setting a second memory state which is different from an initial first memory state of the magnetic memory device.

13. A semiconductor chip comprising:
    a tunnel magnetoresistive structure, wherein a magnetic sensor device is formed in a first portion of the tunnel magnetoresistive structure, and a magnetic memory device is formed in a second portion of the tunnel magnetoresistive structure, the magnetic memory device comprising:
        a memory circuit comprising a first tunnel magnetoresistive element and a second tunnel magnetoresistive element coupled in series; and
        an input node coupled to the first tunnel magnetoresistive element, wherein the input node is configured to receive a voltage signal in a write mode,
        wherein the first tunnel magnetoresistive element initially holds a first resistance value, and wherein the first tunnel magnetoresistive element is short-circuited to hold a second resistance value after the voltage signal is received by the input node, and
        wherein end nodes of the memory circuit are coupled to defined voltages in a read mode, and wherein the magnetic memory device further comprises a readout circuit configured to measure a voltage at a sensing node in the read mode, wherein the sensing node is interconnected between the first tunnel magnetoresistive element and the second tunnel magnetoresistive element.

14. A method for operating a magnetic memory device comprising a memory circuit with a first tunnel magnetoresistive element and a second tunnel magnetoresistive element coupled in series, the method comprising:
    setting the first tunnel magnetoresistive element to a first resistance value or to a second resistance value in a write mode, wherein the first tunnel magnetoresistive element is set to the second resistance value by short circuiting the first tunnel magnetoresistive element,
    wherein end nodes of the memory circuit are coupled to defined voltages in a read mode, and wherein the method further comprises measuring a voltage at a sensing node in the read mode, wherein the sensing node is interconnected between the first tunnel magnetoresistive element and the second tunnel magnetoresistive element.

15. The method of claim 14, wherein the method further comprises determining a first memory state for a first value of the voltage at the sensing node and to determine a second memory state for a second value of the voltage at the sensing node.

16. The method of claim 14, further comprising:
    exposing the first tunnel magnetoresistive element to a magnetic field at a first time instant; and
    verifying that the first tunnel magnetoresistive element is set to the second resistance value by comparing the voltage at the sensing node at the first time instant and the voltage at the sensing node at a second time instant at which a test circuit does not generate the magnetic field.

17. The method of claim 14, wherein a ratio of the first resistance value to the second resistance value is 500or more.

18. The method of claim 14, wherein short circuiting the first tunnel magnetoresistive element comprises applying a voltage to the first tunnel magnetoresistive element which is higher than a breakdown voltage of a magnetic tunnel junction of the first tunnel magnetoresistive element.

19. The magnetic memory device of claim 1, wherein:
    the first tunnel magnetoresistive element and the second tunnel magnetoresistive element are coupled in series between the end nodes, and
    the input node is interconnected between the first tunnel magnetoresistive element and the second tunnel magnetoresistive element.

20. The memory system of claim 12, wherein:
    the first tunnel magnetoresistive element and the second tunnel magnetoresistive element are coupled in series between the end nodes, and
    the input node is interconnected between the first tunnel magnetoresistive element and the second tunnel magnetoresistive element.

21. The semiconductor chip of claim 13, wherein:
    the first tunnel magnetoresistive element and the second tunnel magnetoresistive element are coupled in series between the end nodes, and
    the input node is interconnected between the first tunnel magnetoresistive element and the second tunnel magnetoresistive element.

22. The method of claim 14, wherein the first resistance value corresponds to an intrinsic resistance of a magnetic tunnel junction of the first tunnel magnetoresistive element.

* * * * *